United States Patent [19]
Ahmad et al.

[11] Patent Number: 5,811,329
[45] Date of Patent: Sep. 22, 1998

[54] METHOD OF FORMING CMOS CIRCUITRY INCLUDING PATTERNING A LAYER OF CONDUCTIVE MATERIAL OVERLYING FIELD ISOLATION OXIDE

[75] Inventors: Aftab Ahmad; David J. Keller; Tyler A. Lowrey, all of Boise, Id.

[73] Assignee: Micron Technology, Inc., Boise, Id.

[21] Appl. No.: 655,683

[22] Filed: Jun. 3, 1996

[51] Int. Cl.$^6$ .............................................. H01L 21/8238
[52] U.S. Cl. ......................................................... 438/233
[58] Field of Search ..................................... 438/153, 154, 438/300, 231, 233, 305, 586; 257/377

[56] References Cited

U.S. PATENT DOCUMENTS

5,571,733  11/1996  Wu et al. .................................. 438/231
5,624,863   4/1997  Helm et al. .............................. 438/231

*Primary Examiner*—Brian Dutton
*Attorney, Agent, or Firm*—Wells, St. John, Roberts, Gregory & Matkin, P.S.

[57] ABSTRACT

A method for forming CMOS DRAM circuitry is disclosed and which includes forming a substrate comprising an array NMOS region, a peripheral NMOS region, and a peripheral PMOS region; forming a pair of insulated and spaced gate lines in the array NMOS region; forming at least one electrically conductive plug in the array NMOS region and which spans between the pair of gate lines; forming a barrier layer over the pair of gate lines in the array NMOS region, the peripheral NMOS and the peripheral PMOS region; and patterning and etching in the peripheral PMOS region to form peripheral PMOS region gate lines including removing a portion of the barrier layer in the PMOS peripheral region and leaving barrier layer material in the NMOS region masking over the electrically conductive plug.

28 Claims, 13 Drawing Sheets

METHOD OF FORMING CMOS CIRCUITRY INCLUDING PATTERNING A LAYER OF CONDUCTIVE MATERIAL OVERLYING FIELD ISOLATION OXIDE

TECHNICAL FIELD

This invention relates to a method of forming CMOS circuitry, including patterning a layer of conductive material overlying field isolation oxide.

BACKGROUND OF THE INVENTION

As DRAM's increase in memory cell density, it becomes increasingly difficult to make electrical contact to diffusion regions which are formed in the underlying substrate.

Conventional stacked capacitor DRAM arrays utilize either a buried bit line or non-buried bit line construction. With buried bit line constructions, bit lines are provided in close vertical proximity to the bit line contacts of the memory cell field effect transistor (FET's) with the cell capacitors being formed horizontally over the top of the word lines and bit lines. With non-buried bit line constructions, deep vertical contacts are made through a thick insulating layer to the cell FET's, with a capacitor construction being provided over the word lines and beneath the bit lines. Such non-buried bit line constructions are also referred to as "capacitor-under bit line" or "bit line over capacitor constructions".

In the fabrication of word lines and gates for field effect transistors, the word lines or gates are typically encapsulated or surrounded by a nitride or oxide insulating material. During fabrication, and subsequent to the provision of the nitride or oxide insulating material, an insulating layer such as BPSG is provided outwardly of the gate and over the substrate in adjacent diffusion regions. In view of the increase in memory cell density of DRAM arrays, fabricators of such devices have found it increasingly difficult to selectively remove the BPSG layer, as by etching, relative to both the nitride or oxide layers while simultaneously avoiding the removal of the underlying substrate.

In view of this perceived difficulty, fabricators of such devices have employed, heretofore, a thin, intervening etch stop layer which is disposed in covering relation relative to the word lines, gates and adjacent substrate areas. Such an intervening etch stop layer normally comprises a thin nitride layer. In the practice of the prior art, an etching chemistry is employed which selectively removes the BPSG layer relative to the nitride layer. Thereafter, the nitride is selectively removed relative to the underlying substrate and oxide thus effectively outwardly exposing the diffusion region of the substrate. The resulting contact opening provided by such selective removal is thereafter filled with conductive material which makes electrical contact to the underlying diffusion region.

A method of forming CMOS and other circuitry which avoids the shortcomings of the prior art is the subject matter of the present invention.

BRIEF DESCRIPTION OF THE DRAWINGS

Preferred embodiments of the invention are described below with reference to the following accompanying drawings.

FIG. 3 is a somewhat enlarged, diagrammatic, plan view of the semiconductor wafer shown in FIG. 1.

FIG. 8 is a diagrammatic, plan view of the semiconductor wafer shown in FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first aspect of the present invention relates to a method for forming integrated circuitry, comprising:

providing a semiconductor substrate having discrete regions;

forming a pair of spaced gate lines over a given region of the substrate, and electrically insulating top and sidewall surfaces of the gate lines, and forming a space therebetween;

depositing a first layer of electrically conductive material between the pair of gate lines; and removing a portion of the first layer of electrically conductive material to form a conductive plug spanning between the pair of gate lines.

Another aspect of the present invention relates to a method for forming CMOS integrated circuitry comprising:

forming electrically conductive gate material over a PMOS region and an NMOS region of a substrate;

patterning the gate material to form a pair of spaced gate lines in one of the PMOS or NMOS regions, and electrically insulating top and sidewall surfaces of the gate lines and forming a space therebetween;

depositing a first layer of electrically conductive material over the pair of gate lines;

removing a portion of the first layer of electrically conductive material to form a conductive plug spanning between the pair of gate lines; and after forming the conductive plug, patterning the gate material in the other of the PMOS or NMOS regions to form gate lines.

Moreover, another aspect of the present invention relates to a method for forming CMOS integrated circuitry which comprises:

forming a substrate having a PMOS region and an NMOS region;

forming a pair of spaced gate lines over one of the PMOS or NMOS regions, and electrically insulating top and side wall surfaces of the gate lines;

forming an electrically conductive plug spanning between the pair of gate lines;

forming a barrier layer over the conductive plug; and forming an electrically conductive layer over the barrier layer and the other of the PMOS and NMOS regions, the barrier layer being effective to isolate the electrically conductive layer from the conductive plug.

Moreover, another aspect of the present invention relates to a method of forming CMOS DRAM circuitry comprising:

forming a substrate comprising an array NMOS region, a peripheral NMOS region and a peripheral PMOS region;

forming a pair of insulated and spaced gate lines in the array NMOS region;

forming at least one electrically conductive plug in the array NMOS region which spans between the pair of gate lines;

forming a barrier layer over the pair of gate lines and the array NMOS region, the peripheral NMOS region and the peripheral PMOS region; and patterning and etching in the peripheral PMOS region to form peripheral PMOS region gate lines including removing a portion of the barrier layer in the PMOS peripheral region and leaving barrier layer material in the NMOS region masking over the electrically conductive plug.

Yet still further, another aspect of the present invention relates to a method of patterning a layer of conductive material overlying field isolation oxide which comprises:

forming a first material layer over the conductive material layer;

forming an opening through the first material layer over the field isolation oxide;

forming a second material layer over the first material layer;

removing a portion of the second material layer to form sidewall spacers within the first material layer opening; and removing the conductive material layer through the first opening to the field isolation oxide.

Figure 1:
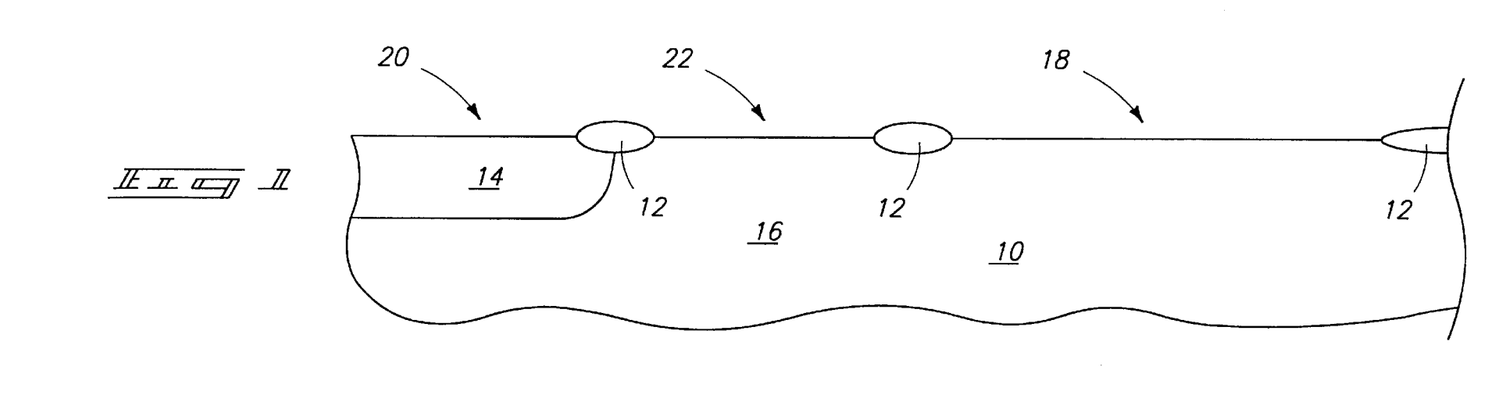
FIG. 1 is a diagrammatic section of a semiconductor wafer shown at one processing step in accordance with the present invention.
Figure 2:
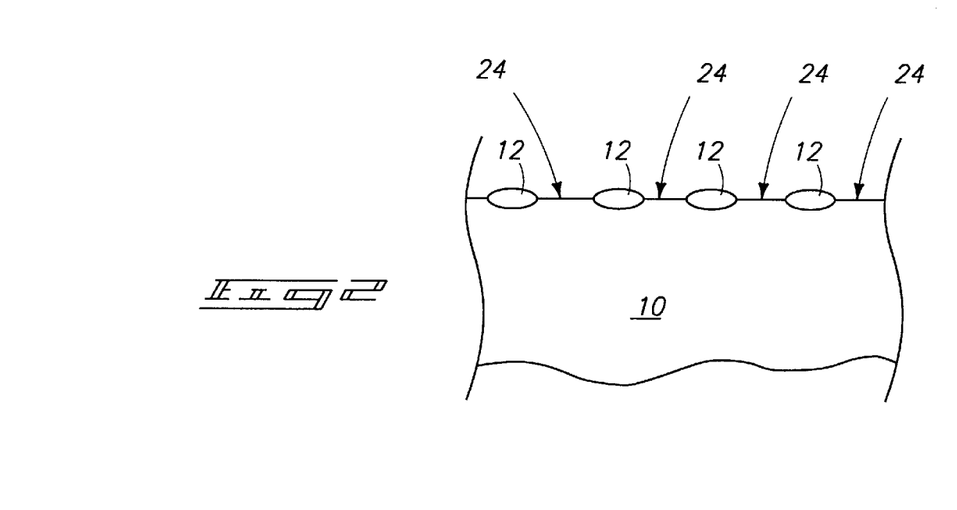
FIG. 2 is a reduced sized diagrammatic section of the semiconductor wafer shown in FIG. 1, the view taken from a position substantially perpendicular to that shown in FIG. 1, and corresponding to line labeled 2—2 in FIG. 3.

Referring now to FIGS. 1–3, a substrate in process for forming CMOS DRAM circuitry is designated generally by the numeral 10. The substrate 10 is formed with field oxide regions 12 which are positioned in predetermined locations. Further, the substrate 10 is processed in a fashion to provide an N well 14; and a corresponding P well 16. The N well further defines a peripheral PMOS region 20, and the P well further defines a corresponding array NMOS region 18, and associated peripheral NMOS region 22. Active area regions 24 are defined between the field oxide regions 12.

Figure 4:
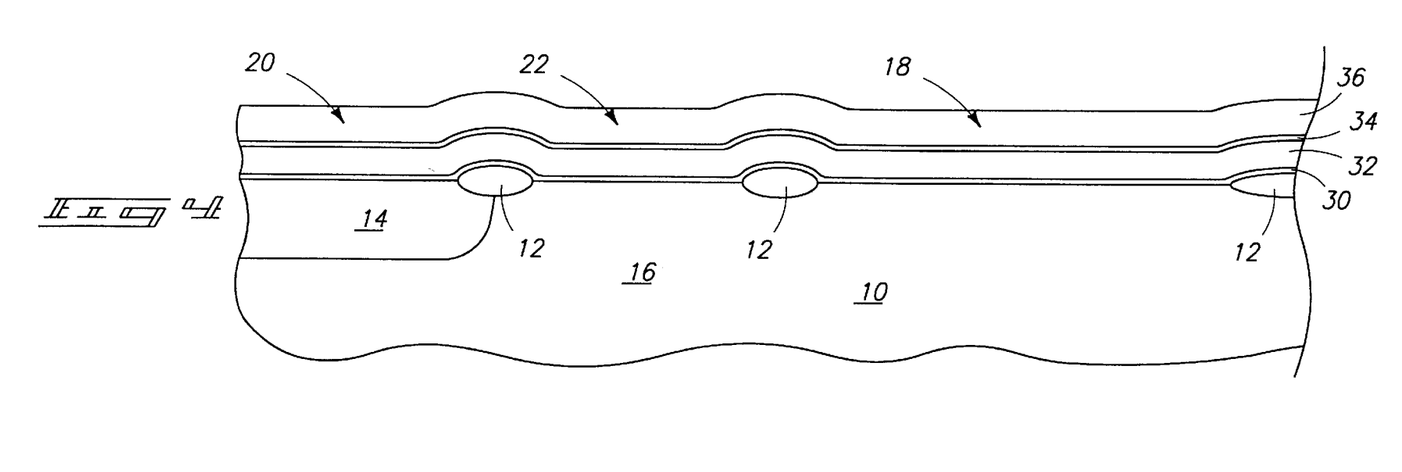
FIG. 4 is a diagrammatic section of the FIG. 1 wafer illustrated at a processing step subsequent to that shown in FIG. 1.
Figure 5:
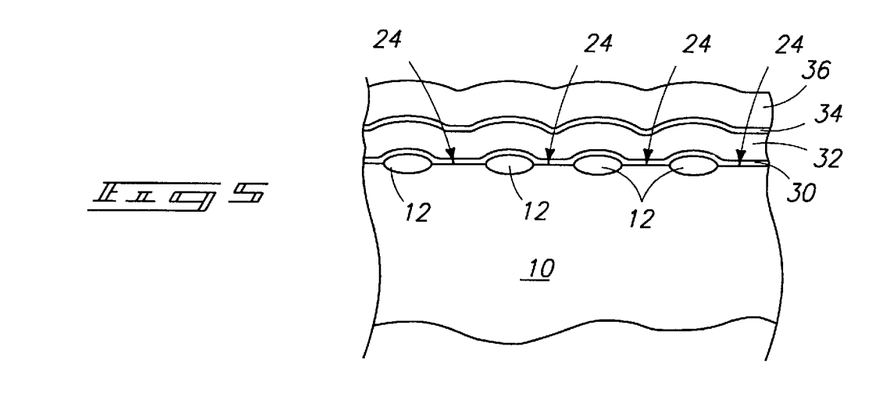
FIG. 5 is a diagrammatic section of the semiconductor wafer shown in FIG. 4, the view taken from the position substantially perpendicular to that shown in FIG. 4.

Referring now to FIGS. 4 and 5, the FIG. 1 wafer is illustrated following the deposit of several layers which will be utilized to form gates. The deposited layers include a gate oxide layer 30 which is formed atop the substrate 10; a polysilicon layer 32 which will operate as the gate electrode and which is formed over the gate oxide layer 30; a refractory metal layer comprising tungsten or other conductive metal 34 which is formed over the polysilicon layer 32; and a layer of oxide 36 which is formed outwardly of the tungsten layer 34. In the alternative, a layer of nitride may be formed in place of the oxide layer 36. The layers 30 through 36 are formed over the entire NMOS and PMOS regions 18, 20 and 22 respectively.

Figure 6:
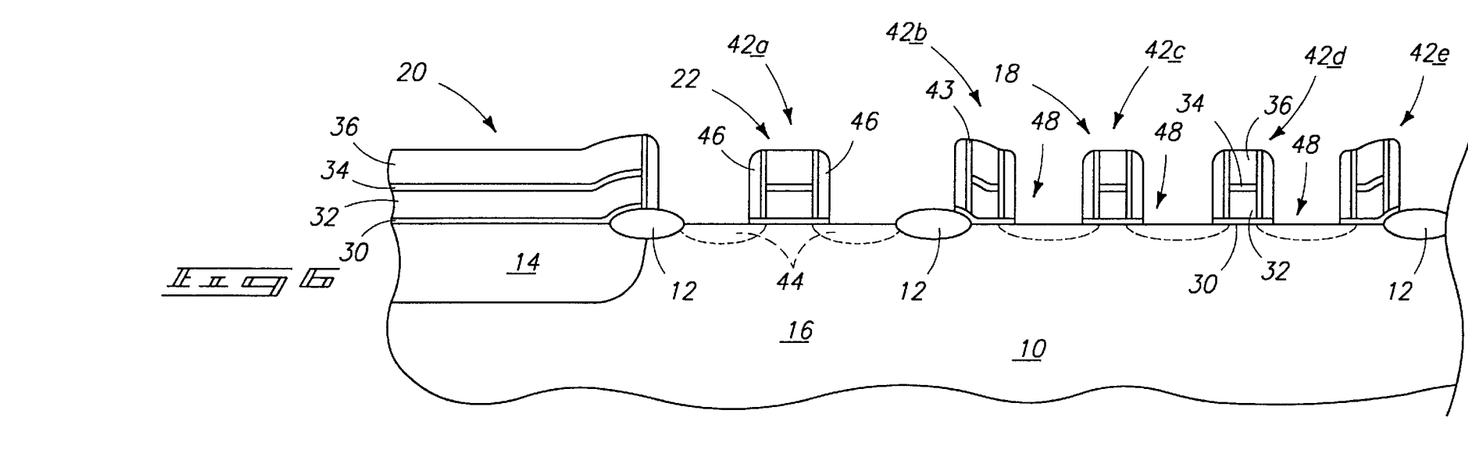
FIG. 6 is a diagrammatic section of the FIG. 1 wafer illustrated at a processing step subsequent to that shown by FIG. 4.
Figure 7:
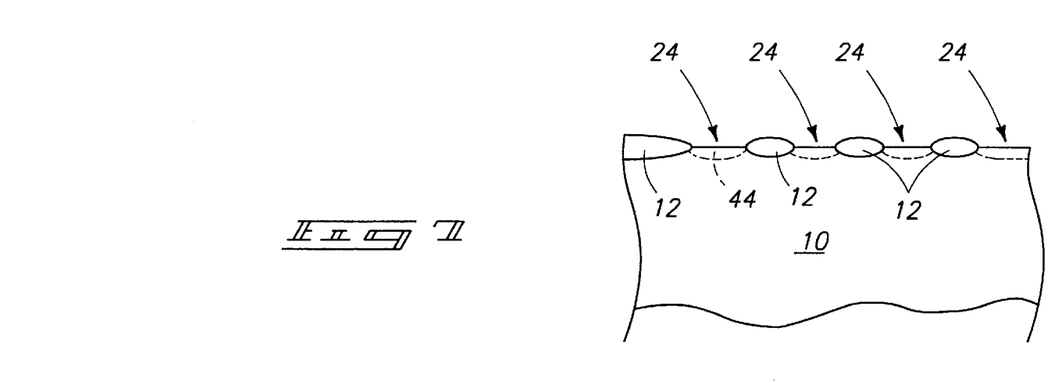
FIG. 7 is a diagrammatic section of the FIG. 6 wafer, the view taken from a position substantially perpendicular to that shown in FIG. 6.

Referring now to FIGS. 6, 7, and 8, the array NMOS area 18 is shown, and wherein a plurality of word lines 42a, 42b, 42c, 42d, 42e, etc. are formed atop the substrate 10. The word lines 42 are formed by means of patterning and removing a portion of the previously deposited layers 30, 32, 34 and 36, by etching, or similar processes, to form the illustrated word lines in the array NMOS area 18, and the peripheral NMOS area 22, but not in PMOS peripheral area 20. Following the patterning and removal of a portion of the gate material, an optional boron halo implant may be conducted. Following the boron halo implant, a source and drain reoxidation takes place, which forms a thin layer of oxide 43 on the individual word lines 42. Following the source and drain reoxidation, an LDD implant 44 may be formed. Following the LDD implant, a layer of nitride is formed and anisotropically etched to provide insulating spacers 46 which are positioned between the individual word lines 42. Thus, the word or gate lines 42 have top surfaces which are insulated by layer/caps 36, and sidewalls insulated by spacers 46 and oxide 43. The individual spacers 46 define an opening or space 48 between the word lines 42. This is seen most clearly by reference to FIGS. 6 and 8, respectively. The discussion hereinafter proceeds primarily with reference to the pair of gate lines 42c and 42d, although the illustrated and preferred processing occurs throughout all the gate lines on the wafer. Thus, at this point in the preferred process, at least one pair of insulated gate lines is provided relative to at least one of the PMOS or NMOS regions, with lines 42c and 42d being provided in NMOS array region 18.

Figure 9:
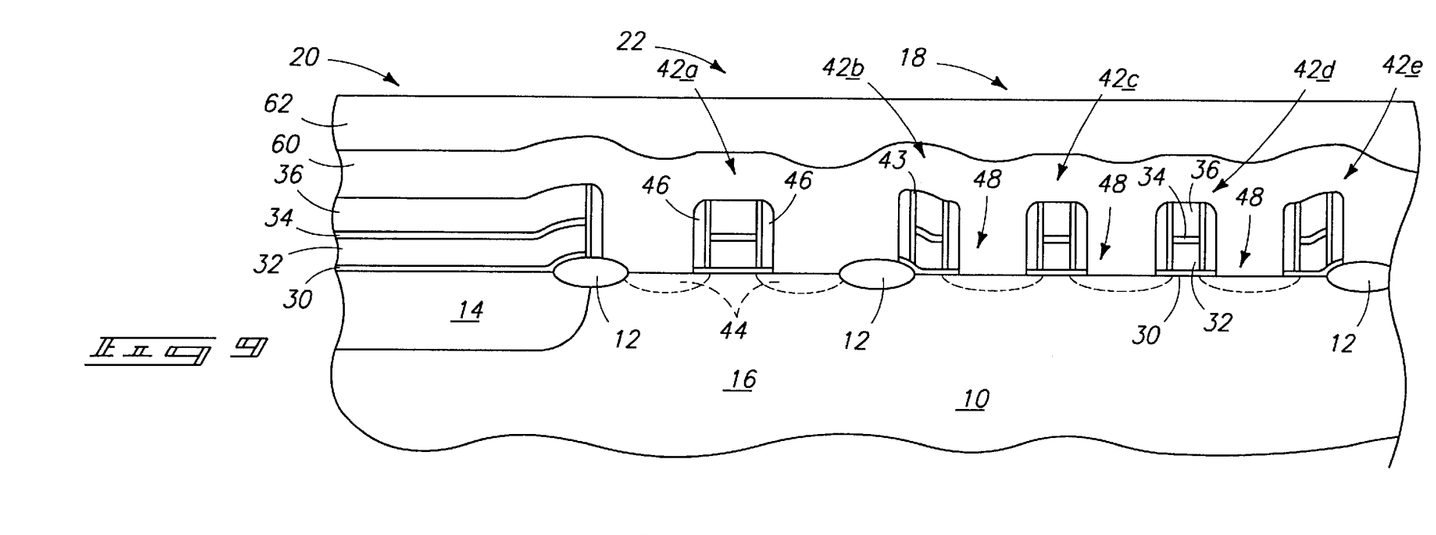
FIG. 9 is a diagrammatic section of the FIG. 1 wafer illustrated at a processing step subsequent to that shown in FIG. 6.
Figure 10:
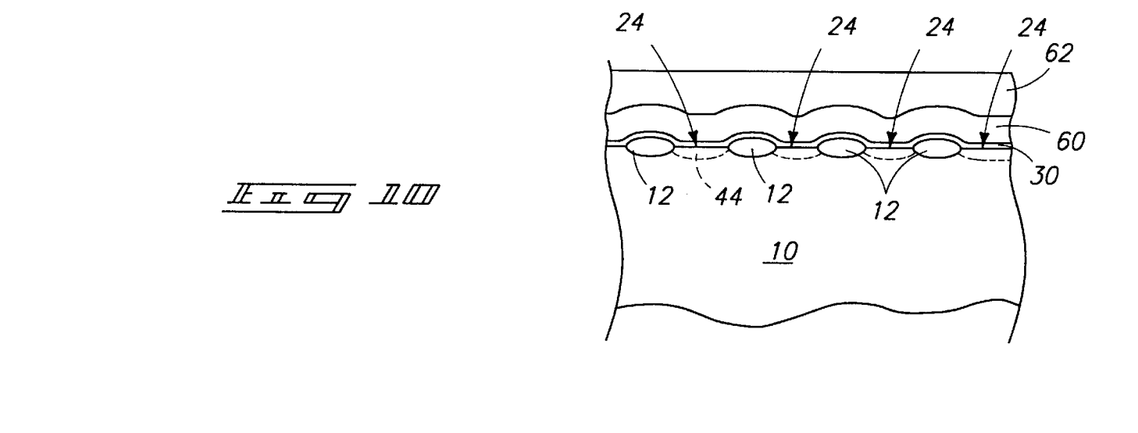
FIG. 10 is a diagrammatic section of the semiconductor wafer shown in FIG. 9, the view taken from a position substantially perpendicular to FIG. 9.
Figure 11:
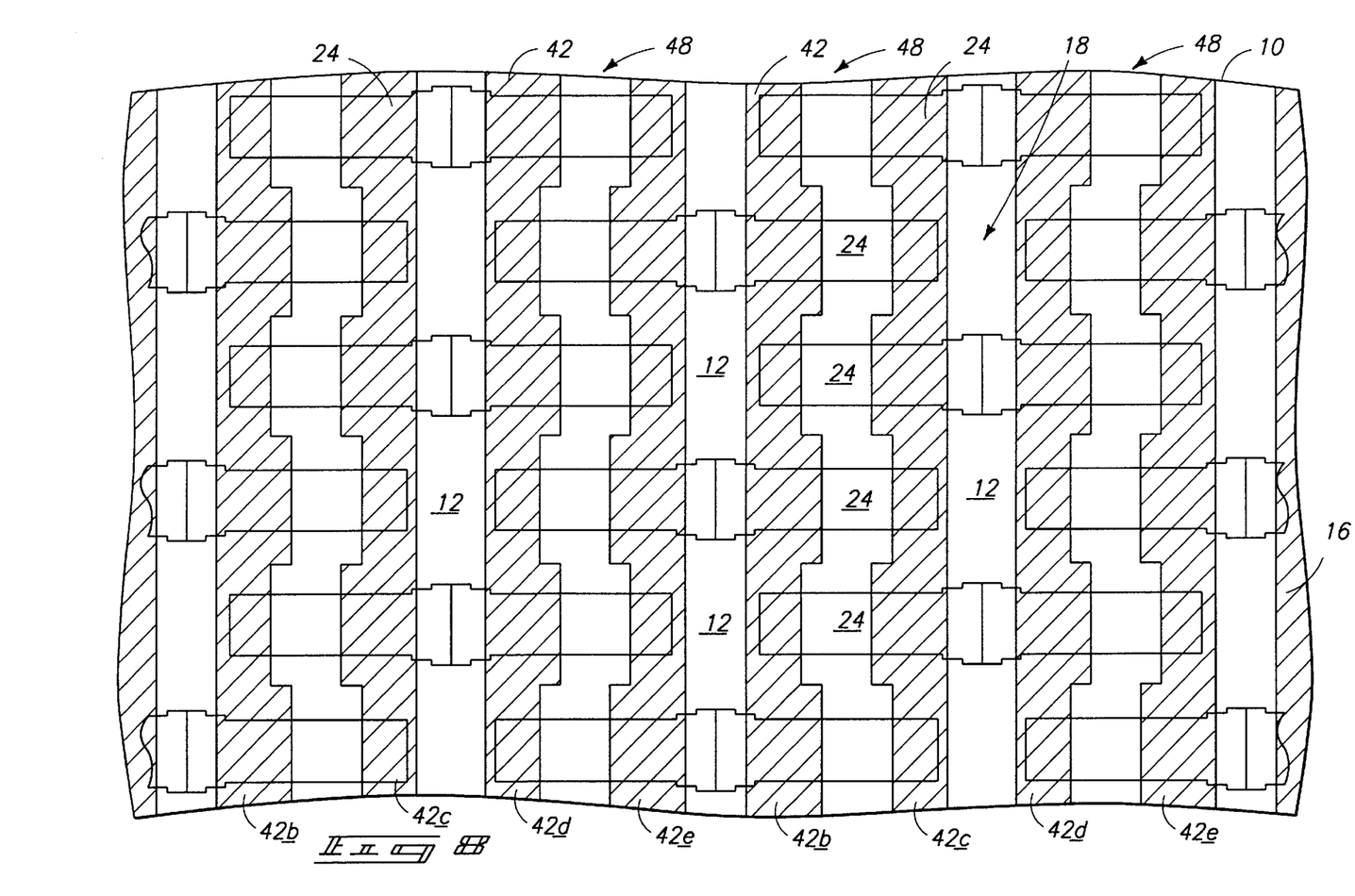
FIG. 11 is a diagrammatic, plan view of the semiconductor wafer shown in FIG. 9.

Referring now to FIGS. 9, 10, and 11, respectively, an electrically conductive first layer of material 60, preferably comprising n-type polysilicon, is deposited effective to overfill the space 48 between adjacent pairs of gate lines 42.

Subsequently, a layer of photoresist 62 is formed atop the electrically conductive first layer 60.

Figure 12:
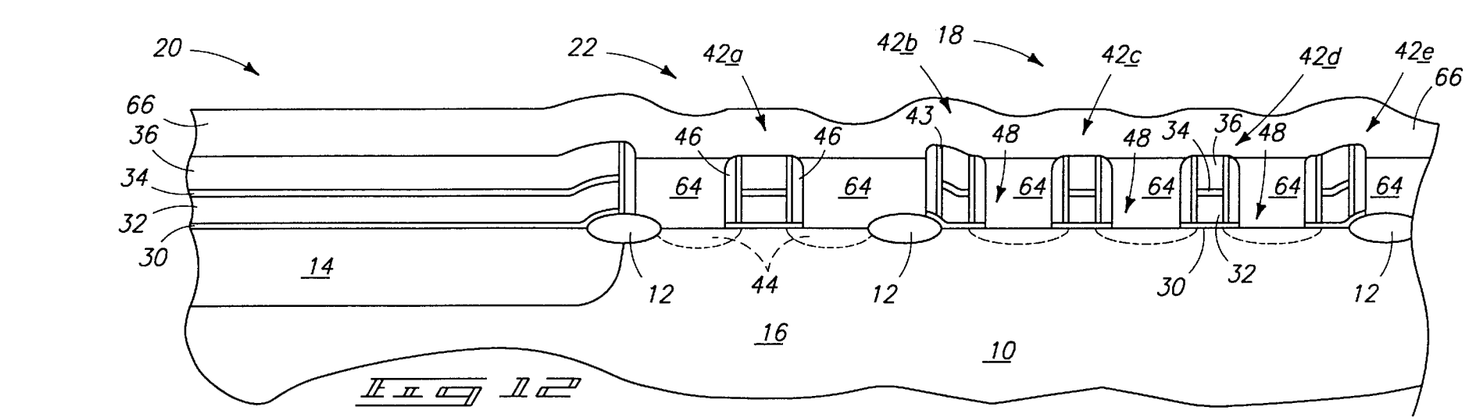
FIG. 12 is a diagrammatic section of the FIG. 1 wafer illustrated at a processing step subsequent to that shown by FIG. 9.

Referring now to FIG. 12 and without photomasking (patterning) in at least one space 48 between a pair of adjacent gate lines 42, the FIG. 9 wafer is shown following a photoresist etch back of layers 62 and 60 respectively. Thus, individual conductive plugs 64 spanning between adjacent pairs of gate lines 42 are formed. Material 60 of plugs 64 also overlies field oxide 12 in the plane running perpendicular to the FIG. 12 depiction (i.e., see FIG. 14). One alternate method for forming the plugs 64 comprises chemical-mechanical polishing. Alternatives also include mechanical contact, and non-slurry based operations. Following the n-type polysilicon layer 60 removal to form individual conductive plugs 64, a layer 66 of oxide, which operates as a barrier layer, is formed over the plugs 64, word lines 42, which are located in array NMOS region 18, and all of adjoining peripheral PMOS region 20, and peripheral NMOS region 22.

Figure 13:
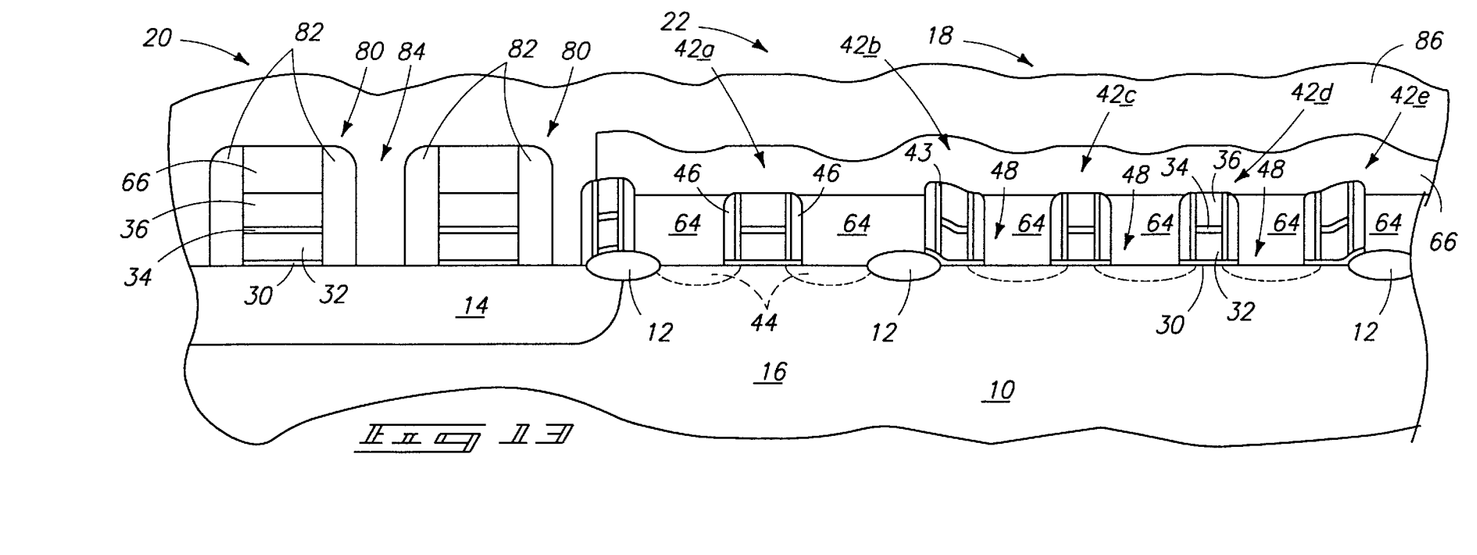
FIG. 13 is a diagrammatic section of the FIG. 1 wafer illustrated at a processing step subsequent to that shown in FIG. 12.
Figure 14:
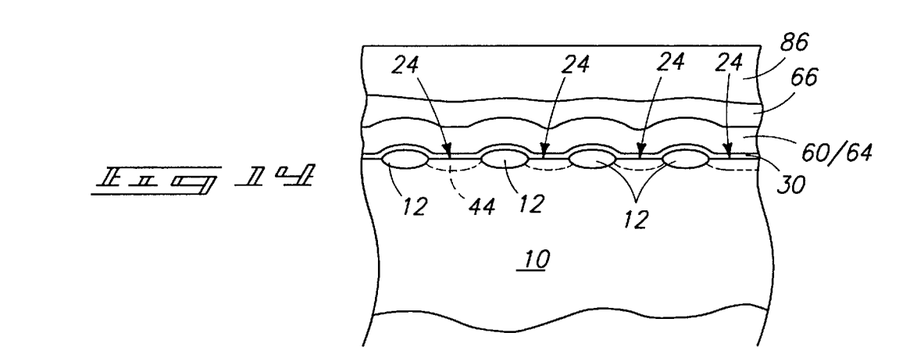
FIG. 14 is a diagrammatic section of the FIG. 13 wafer, the view taken from a position substantially perpendicular to that shown in FIG. 13.
Figure 15:
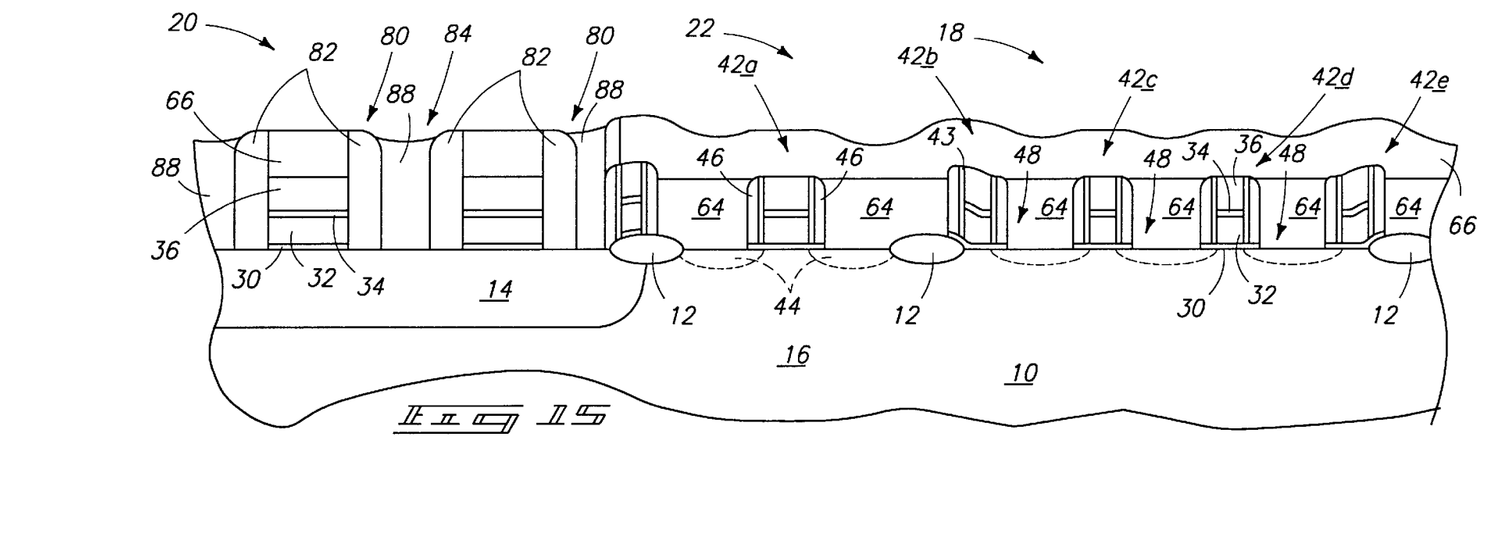
FIG. 15 is a diagrammatic section of the FIG. 1 wafer illustrated at a processing step subsequent to that shown in FIG. 13.
Figure 16:
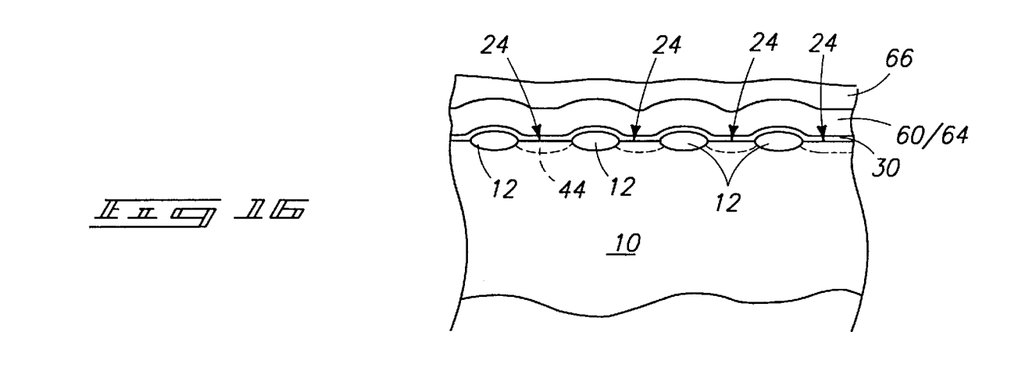
FIG. 16 is a diagrammatic section of the FIG. 15 wafer, the view taken from a position substantially perpendicular to that shown in FIG. 15.

Referring now to FIGS. 13 and 14, the barrier layer 66, and layers thereunder, are patterned and etched to form a plurality of gate lines 80 in the peripheral PMOS region 20. Thus, gate material in PMOS region 20 is patterned after forming the conductive plugs 64. Further, barrier layer material 66 is left over the NMOS region 18 masking over the electrically conductive plugs 64 and associated gate lines 42. Following the formation of the gate lines 80, a layer of nitride is formed and anisotropically etched to define the nitride spacers 82. The nitride spacers 82 cover the sidewalls of the respective gate lines 80. The nitride spacers 82 define a space 84 therebetween. A second electrically conductive layer 86 is formed thereafter. The second electrically conductive layer 86 overfills the space 84 between the respective gate lines 80. As will be recognized, barrier layer 66 in the NMOS array area 18 effectively isolates layer 86 from plugs 64. The second electrically conductive layer 86 preferably comprises p-type polysilicon. Subsequently, the second electrically conductive layer 86 is etched by time selective or planarizing techniques relative to the oxide layer 66 to form conductive plugs 88 which span between the respective gate lines 80. Such is most preferably conducted without any photomasking (patterning) between the gate lines 80. This is illustrated most clearly by reference to FIGS. 15 and 16, respectively.

Figure 17:
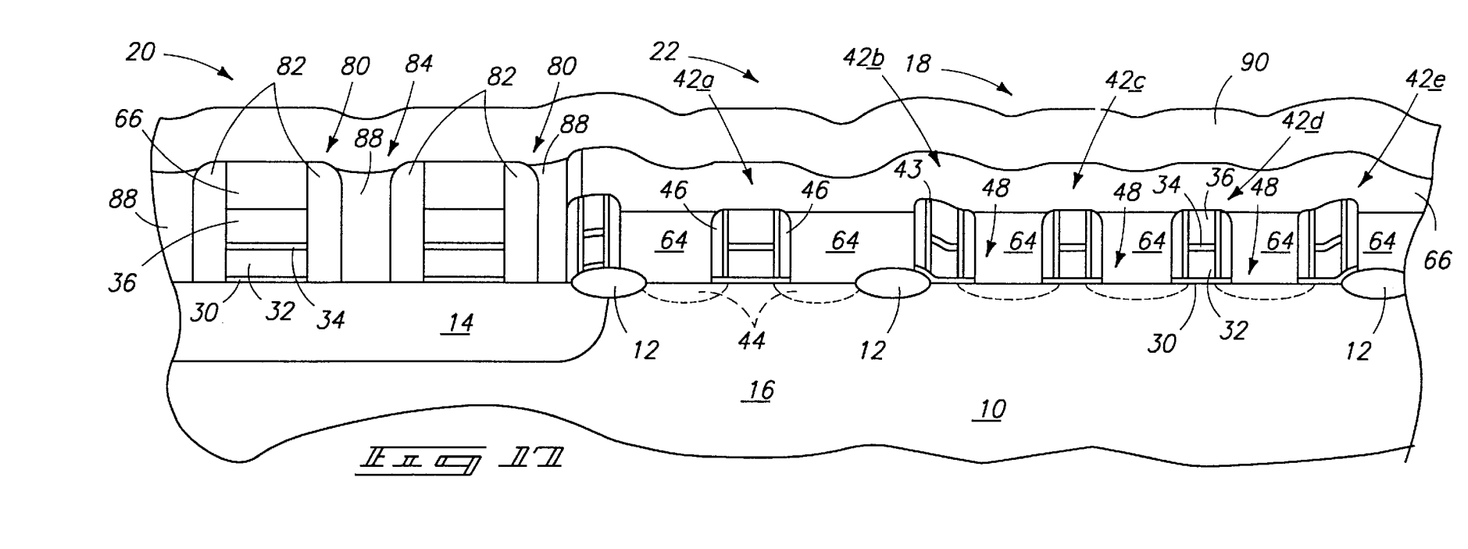
FIG. 17 is as diagrammatic section of the FIG. 1 wafer illustrated at a processing step subsequent to that shown in FIG. 15.
Figure 18:
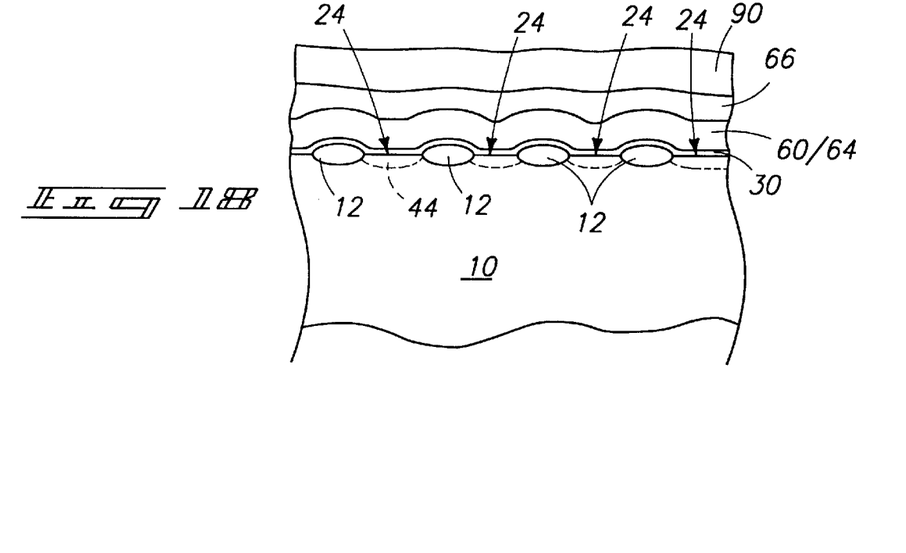
FIG. 18 is a diagrammatic section of the FIG. 1 wafer illustrated at a processing step subsequent to that shown in FIG. 17, the view taken from a position substantially perpendicular to that shown in FIG. 17.
Figure 19:
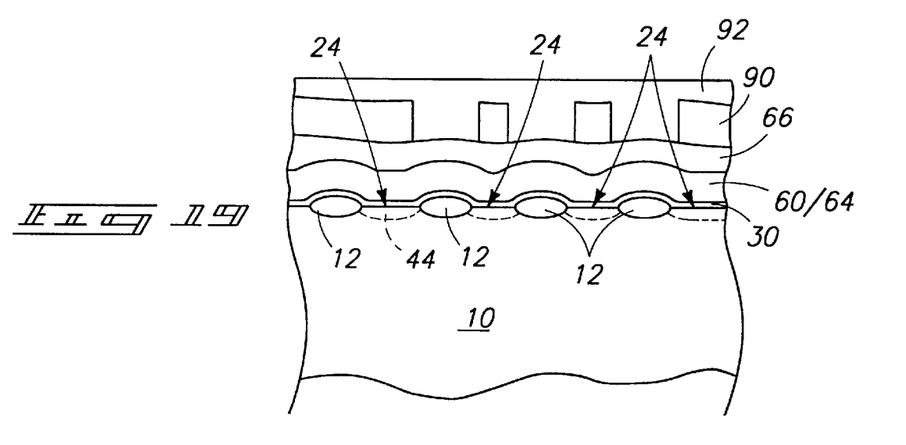
FIG. 19 is a diagrammatic section of the FIG. 1 wafer illustrated at a processing step subsequent to that shown in FIG. 18, the view taken from a position substantially perpendicular to FIG. 17.
Figure 20:
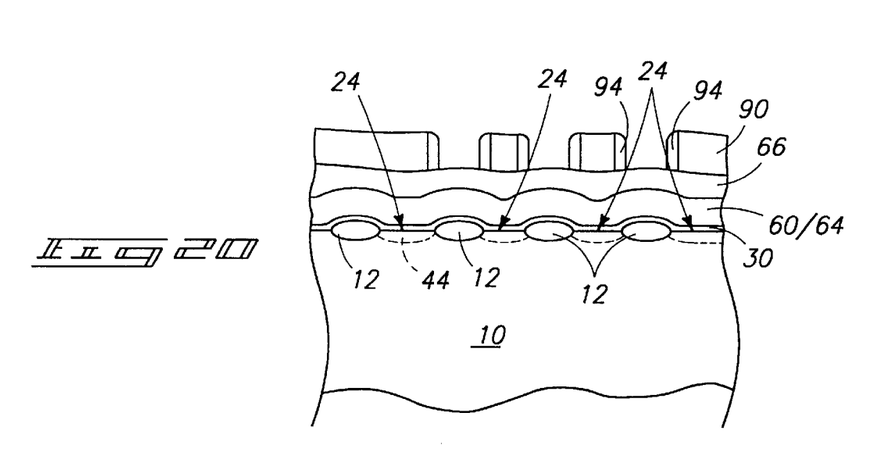
FIG. 20 is a diagrammatic section of the FIG. 1 wafer illustrated at a processing step subsequent to that shown in FIG. 19, the view taken from a position substantially perpendicular to FIG. 17.

Referring now to FIGS. 17 and 18, a layer of nitride 90 is formed over the NMOS and PMOS regions 18, 20, and 22, respectively. A method of patterning a layer of conductive material 60 overlying field isolation oxide 12 is shown at a first processing step beginning at FIG. 18. In particular, the first conductive material layer comprising n-type polysilicon 60 is shown overlying discrete field isolation oxide regions 12. Still further, an oxide or barrier layer 66 is formed atop the first conductive layer 60, and a nitride layer 90 is formed atop the barrier layer 66. The nitride layer 90 comprises a first material which is formed over the conductive material layer 60. Thereafter, openings 96 are etched or formed through the first material layer 90 over the field isolation oxide 12. This is shown in FIG. 19. Following the etching or formation of the openings 96, a second material layer 92, preferably comprising oxide, is formed atop the first material layer. It is thereafter anisotropically etched to form sidewall spacers 94 within openings 96, as seen in FIG. 20. The sidewall spacers 94 further define and partially occlude the openings 96 over the underlying field oxide region 12. In the depicted embodiment, layer 66 comprises an intermediate material layer provided intermediate the first material layer 90 and the conductive material layer 60. Preferably, the second material layer 92 of spacers 94, and that of intermediate layer 66 are predominantly the same material. Preferably, layer 66 comprises $SiO_2$ in the form of BPSG whereas material 92 of spacers 94 comprises lower doped or undoped $SiO_2$.

Figure 21:
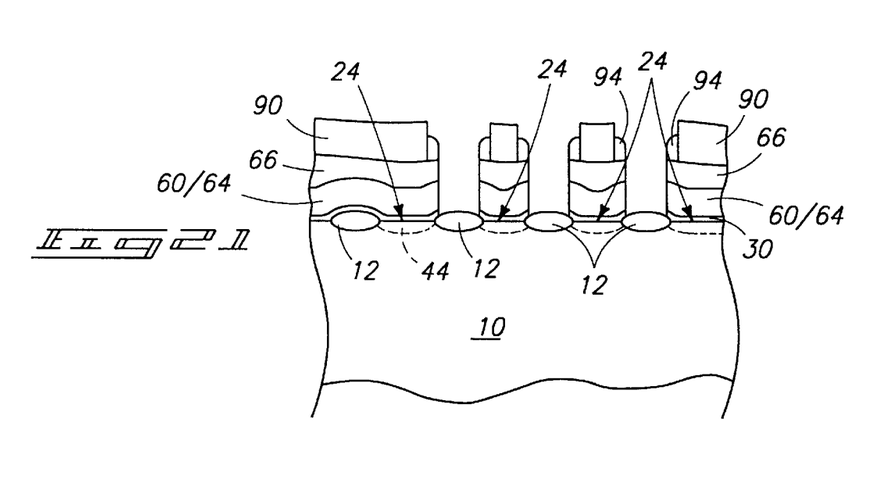
FIG. 21 is a view of the FIG. 1 wafer illustrated at a processing step subsequent to that shown in FIG. 20, the view taken from a position substantially perpendicular to FIG. 17.
Figure 22:
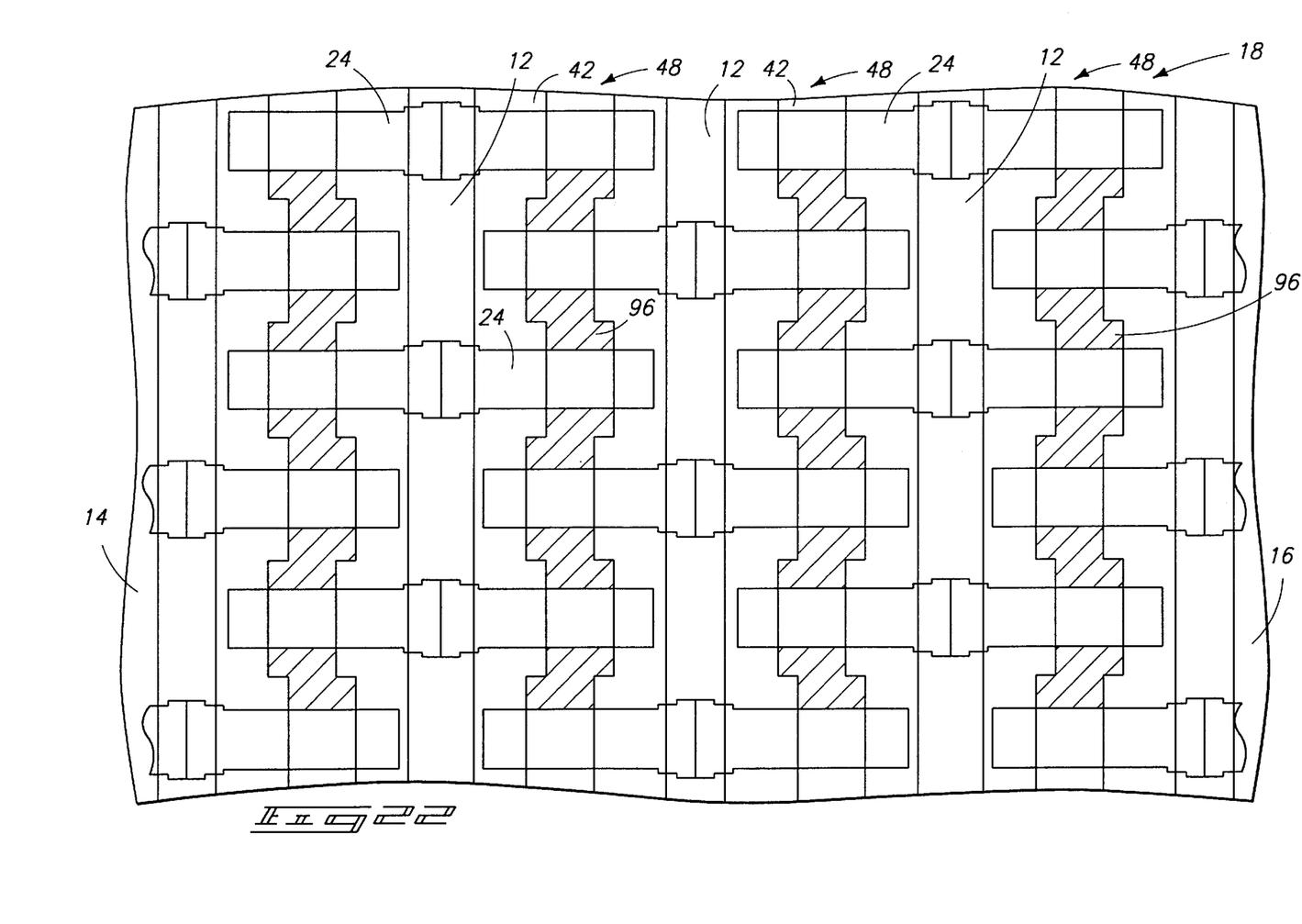
FIG. 22 is a plan view of the FIG. 1 wafer taken at a processing step subsequent to that shown in FIG. 21.

Referring now to FIG. 21, the barrier layer 66, and the conductive material layer 60 are selectively etched or removed through each of the openings 96 to the underlying field oxide region 12. The resulting construction is seen in the plan view of FIG. 22. Such etching will also typically etch spacers 94, some, thereby effectively shortening such spacers as shown. Subsequently, openings 96 would be plugged with an electrically insulative material. Subsequent processing can occur for provision of capacitor constructions and bit line contacts to appropriate conductive NMOS array plugs 64, as will be appreciated by the skilled artisan. Processing would also occur for meeting appropriate devise construction and electrical connection relative to peripheral plugs 64 and 88, respectively.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method for forming CMOS DRAM circuitry, comprising:

forming a substrate comprising an array NMOS region, a peripheral NMOS region, and a peripheral PMOS region;

forming a pair of insulated and spaced gate lines in the array NMOS region;

forming at least one electrically conductive plug in the array NMOS region which spans between the pair of gate lines;

forming a barrier layer over the pair of gate lines, and the array NMOS region, the peripheral NMOS region and the peripheral PMOS region; and     patterning and etching in the peripheral PMOS region to form peripheral PMOS region gate lines including removing a portion of the barrier layer in the PMOS peripheral region and leaving barrier layer material in the NMOS region masking over the electrically conductive plug.

2. A method as claimed in claim 1, wherein after patterning the electrically conductive gate lines in the peripheral PMOS region, forming an electrically conductive layer over the barrier layer and between the gate lines in the PMOS region.

3. A method as claimed in claim 22, wherein after forming the electrically conductive layer, removing a portion of the conductive layer substantially selectively relative to the barrier layer to define at least one conductive plug spanning between adjacent gate lines in the peripheral PMOS region.

4. A method as claimed in claim 1, wherein the conductive plug also overlies field isolation oxide, the method further comprising:

forming a first material layer over the conductive plug overlying the field oxide;

forming an opening through the first material layer over the conductive plug;

forming a second material layer over the first material layer;

removing a portion of the second material layer to form sidewall spacers within the first material layer opening; and removing the conductive plug layer through the first material layer opening to the field isolation oxide.

5. A method for forming integrated CMOS circuitry, comprising:

providing a semiconductor substrate having discrete PMOS and NMOS regions;

forming electrically conductive gate material over the PMOS and NMOS regions of the substrate;

forming a first pair of spaced gate lines in one of the PMOS or NMOS regions, and electrically insulating top and sidewall surfaces of the gate lines, and forming a first space therebetween;

depositing a first layer of electrically conductive material between the first pair of gate lines; and removing a portion of the first layer of electrically conductive material to form a first conductive plug spanning between the first pair of gate lines.

6. A method as claimed in claim 5, wherein after forming the conductive plug spanning between the first pair of gate lines in one of the PMOS or NMOS regions, patterning the gate material in the other of the PMOS or NMOS regions to form a second pair of gate lines.

7. A method as claimed in claim 6, wherein after patterning the gate material in the other of the PMOS or NMOS regions, electrically insulating top and sidewall surfaces of the second pair of gate lines in the other of the PMOS and NMOS regions, and forming a second space therebetween.

8. A method as claimed in claim 5, wherein after removing a portion of the electrically conductive material to form the conductive plug, and before patterning the gate material in the other of the PMOS or NMOS regions, forming and patterning a barrier layer over the NMOS and PMOS regions.

9. A method as claimed in claim 8, wherein after patterning the barrier layer and the second pair of gate lines in the other of the NMOS or PMOS regions, forming a second layer of electrically conductive material over the NMOS and PMOS regions, the second layer of electrically conductive material filling a second space defined between at least one adjacent second pair of gate lines in the other of the NMOS and PMOS regions.

10. A method as claimed in claim 9, wherein after forming the second layer of electrically conductive material, and without photomasking the second layer of conductive material in the second space between the adjacent second pair of gate lines in the other of the NMOS and PMOS regions, removing a portion of the second layer of electrically conductive material to form a second conductive plug which spans between the second pair of adjacent gate lines formed in the other of the NMOS or PMOS regions.

11. A method for forming CMOS integrated circuitry, comprising:

forming electrically conductive gate material over a PMOS region and an NMOS region of a substrate;

patterning the gate material to form a pair of spaced gate lines in one of the PMOS or NMOS regions, and electrically insulating top and sidewall surfaces of the gate lines and providing a space therebetween;

depositing a first layer of electrically conductive material over the pair of gate lines;

removing a portion of the first layer of electrically conductive material to form a conductive plug spanning between the pair of gate lines; and after forming the conductive plug, patterning the gate material in the other of the PMOS or NMOS regions to form gate lines.

12. A method as claimed in claim 11, wherein removing a portion of the electrically conductive first layer to form the conductive plug comprises chemical mechanical polishing.

13. A method as claimed in claim 11, wherein removing a portion of the electrically conductive first layer to form the conductive plug comprises a photoresist etch back.

14. A method as claimed in claim 11, wherein after patterning the gate material in the other of the PMOS or NMOS regions to form the gate lines, electrically insulating top and sidewall surfaces of the gate lines in the other of the PMOS and NMOS regions, and providing a second space therebetween.

15. A method as claimed in claim 11, wherein after removing a portion of the first layer of electrically conductive material to form the conductive plug, and before patterning the gate material in the other of the PMOS or NMOS regions, forming a barrier layer over the NMOS and PMOS regions.

16. A method as claimed in claim 15, wherein the barrier layer comprises an oxide.

17. A method as claimed in claim 15, wherein the patterning of the gate material in the other of the NMOS or PMOS regions to form the gate lines also comprises patterning of the barrier layer; and wherein after patterning the barrier layer and the gate lines in the other of the NMOS or PMOS regions, forming a second layer of electrically conductive material over the other of the NMOS and PMOS regions, the second layer of electrically conductive material filling a second space between at least one adjacent second pair of gate lines in the other of the NMOS and PMOS regions.

18. A method as claimed in claim 17, wherein the first layer of electrically conductive material comprises n-type polysilicon, and the second layer of electrically conductive material comprises p-type polysilicon.

19. A method as claimed in claim 17, wherein after providing the second layer of electrically conductive material and without photomasking the second layer of electrically conductive material in the second space between the adjacent pair of gate lines in the other of the NMOS and PMOS regions, etching the second layer of electrically conductive material to form a second conductive plug which spans between the one pair of adjacent gate lines formed in the other of the NMOS or PMOS regions.

20. A method as claimed in claim 11, wherein the conductive plug also overlies field isolation oxide, the method further comprising:

forming a first material layer over the conductive plug overlying the field oxide;

forming an opening through the first material layer over the conductive plug;

forming a second material layer over the first material layer;

removing a portion of the second material layer to form sidewall spacers within the first material layer opening; and removing a portion of the conductive plug layer through the first material layer opening to the field isolation oxide.

21. A method as claimed in claim 20, wherein after removing a portion of the first layer of electrically conductive material to form the conductive plug, and before patterning the gate material in the other of the PMOS or NMOS regions, forming a barrier layer over the other of the NMOS and PMOS regions, the barrier layer being provided intermediate the first material layer and the conductive plug.

22. A method for forming CMOS integrated circuitry comprising:

forming a substrate having a PMOS region and an NMOS region;

forming a pair of spaced gate lines over one of the PMOS or NMOS regions, and electrically insulating top and sidewall surfaces of the gate lines;

forming an electrically conductive plug spanning between the pair of gate lines;

forming a barrier layer over the conductive plug; and forming an electrically conductive layer over the barrier layer and the other of the PMOS or NMOS regions, the barrier layer being effective to isolate the electrically conductive layer from the conductive plug.

23. A method as claimed in claim 22, wherein the electrically conductive plug comprises conductively doped polysilicon.

24. A method as claimed in claim 22, wherein the barrier layer comprises an oxide.

25. A method as claimed in claim 22, wherein prior to providing the electrically conductive layer, providing a pair of spaced gate lines in the other of the PMOS or NMOS regions.

26. A method as claimed in claim 25, wherein after providing the pair of gate lines in the other of the NMOS or PMOS regions, and before providing the electrically conductive layer, electrically insulating top and sidewall surfaces of the pair of gate lines in the other of the NMOS or PMOS regions, and providing a space therebetween.

27. A method as claimed in claim 22, wherein the electrically conductive plug comprises n-type polysilicon, and the conductive layer comprises p-type polysilicon.

28. A method as claimed in claim 22, wherein the conductive plug also overlies field isolation oxide, the method further comprising:

forming a first material layer over the conductive plug overlying the field oxide;

forming an opening through the first material layer over the conductive plug;

forming a second material layer over the first material layer;

removing a portion of the second material layer to form sidewall spacers within the first material layer opening; and removing the conductive plug layer through the first material layer opening to the field isolation oxide.

* * * * *